United States Patent
Li et al.

(10) Patent No.: US 11,317,511 B2
(45) Date of Patent: Apr. 26, 2022

(54) CIRCUIT BOARD

(71) Applicant: SHENNAN CIRCUITS CO., LTD., Shenzhen (CN)

(72) Inventors: Zhi Li, Shenzhen (CN); Xuechuan Han, Shenzhen (CN); Rong Cui, Shenzhen (CN); Zhenbo Liu, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 0 days.

(21) Appl. No.: 17/090,915

(22) Filed: Nov. 6, 2020

(65) Prior Publication Data
US 2021/0084761 A1   Mar. 18, 2021

Related U.S. Application Data

(63) Continuation of application No. PCT/CN2019/098737, filed on Jul. 31, 2019.

(51) Int. Cl.
*H05K 1/11* (2006.01)
*H05K 1/02* (2006.01)

(52) U.S. Cl.
CPC ........... *H05K 1/115* (2013.01); *H05K 1/0298* (2013.01); *H05K 2201/09036* (2013.01); *H05K 2201/09509* (2013.01)

(58) Field of Classification Search
CPC ................. H05K 1/115; H05K 1/0298; H05K 2201/09036; H05K 2201/09509;
(Continued)

(56) References Cited

U.S. PATENT DOCUMENTS 5,227,013 A * 7/1993 Kumar ................ H01L 21/486
216/18
5,826,330 A * 10/1998 Isoda ..................... H05K 3/421
219/121.74
(Continued)

FOREIGN PATENT DOCUMENTS

CN          102194703 A       9/2011
CN          104519659 A       4/2015
(Continued)

OTHER PUBLICATIONS

International Search Report, International Application No. PCT/CN2019/098737, dated Apr. 24, 2020 (7 pages).
(Continued)

*Primary Examiner* — Steven T Sawyer (57) ABSTRACT

The present disclosure provides a circuit board. The circuit board may include a number of stacked core boards each having a top surface. At least part core boards of the number of stacked core boards may include circuit layers at top surfaces thereof. A groove may be defined through the at least part core boards. A conductive material may be received in the groove configured to couple to the circuit layers of at least two core boards. A cross section of the groove may include a length in a first direction and a length in a second direction, and the length in the first direction may be greater than the length in the second direction. Electroplating solution may capable of contacting any portions of the groove to electroplate, to form the conductive material.

16 Claims, 5 Drawing Sheets

(58) Field of Classification Search
CPC ......... H05K 3/429; H05K 2201/09854; H05K 2201/09563; H05K 3/421; H05K 2201/09518
See application file for complete search history.

(56) References Cited

U.S. PATENT DOCUMENTS

| | | | | |
|---|---|---|---|---|
| 6,590,165 | B1* | 7/2003 | Takada | H05K 3/421 174/266 |
| 9,756,735 | B2 | 9/2017 | Ishihara | |
| 2005/0092521 | A1* | 5/2005 | Jones | H05K 1/115 174/262 |
| 2006/0225917 | A1* | 10/2006 | Hu | H05K 3/4007 174/257 |
| 2008/0225501 | A1* | 9/2008 | Cho | H05K 3/421 361/767 |
| 2011/0074041 | A1* | 3/2011 | Leung | H05K 1/113 257/774 |
| 2013/0146349 | A1* | 6/2013 | Lee | H05K 1/115 174/262 |
| 2013/0213701 | A1* | 8/2013 | Iida | H05K 3/4652 174/257 |
| 2016/0366768 | A1* | 12/2016 | Matsuda | H05K 3/4685 |

FOREIGN PATENT DOCUMENTS

| | | |
|---|---|---|
| CN | 104602446 A | 5/2015 |
| CN | 105307423 A | 2/2016 |
| JP | H04148591 A | 5/1992 |
| JP | H04162795 A | 6/1992 |
| JP | 2002064274 A | 2/2002 |
| JP | 2009124098 A | 6/2009 |
| JP | 2012156498 A | 8/2012 |
| KR | 20090106723 A | 10/2009 |
| WO | WO2012132325 A1 | 10/2012 |

OTHER PUBLICATIONS

Notice of Reasons for Refusal, Japanese Application No. 2020-568500, dated Jan. 18, 2022 (6 pages).
Notification of Reason for Refusal, Korean Application No. 10-2020-7032522, dated Feb. 25, 2022 (21 pages).

* cited by examiner

CIRCUIT BOARD

CROSS-REFERENCE TO RELATED APPLICATIONS

The present application is a continuation-application of International (PCT) Patent Application No. PCT/CN2019/098737, filed on Jul. 31, 2019, the entire contents of which are hereby incorporated by reference.

FIELD

The described embodiments relate to a circuit board technology, and more particularly, to a circuit board.

BACKGROUND

As an important electronic connector, a printed circuit board (PCB) is used in almost all electronic products and is regarded as "the mother of electronic system products." Electronic products currently present two obvious trends, one is light, thin, short and small, and the other is high-speed and high-frequency, which accordingly drives PCBs in downstream to develop in the direction of high density, high integration, packaging, miniaturization, and multilayer, so that the demand for boards and high density interconnect (HDI) is increasing day by day. High multi-layer boards have a short wiring length, low circuit impedance, high frequency and a high speed operation, stable performance, and more complex functions. This is an inevitable trend for electronic technology to develop toward high speed, high frequency, multi-function and a large capacity. In particular, the in-depth application of large-scale integrated circuits will further drive PCBs towards a high-precision and a high-level.

The wiring density of HDI has obvious advantages over ordinary multilayer boards, and it is increasingly used in backbone networks in the communications field. The wiring density of a communication network switches and routing products is getting higher and higher. The wiring space is getting less and less. The limited space is required to be able to transmit more signals. Ordinary multilayer boards have been unable to meet the demand. The HDI circuit board adopts a build-up method to make a circuit board. The ordinary multi-layer board is used as a core board to stack the build-up layers, so that the process of drilling and metallization in the hole enables the interconnection function between the circuit layers. Compared with the ordinary multi-layer boards with only through holes, HDI accurately sets blind holes and buried holes to reduce the number of through holes, and the PCB wiring area is saved, and component density is greatly increased.

Currently, the HDI technology may realize a cross-layer connection, such as the connection of L1-3 and L1-4 layers. Currently, the general HDI in the industry may achieve an aspect ratio of electroplating capacity of about 1:1, and the individual aspect ratio may reach 1.2:1. However, due to the limitation of the plating solution exchange capacity of blind holes, when the aspect ratio exceeds 1.2:1, the electroplating and metallization of blind holes become a bottleneck, HDI technology to achieve more levels of interconnection under a relatively simple process is restricted.

SUMMARY

The present disclosure mainly provides a circuit board to improve wiring density of printed circuit board products.

A technical solution adopted in the present disclosure is to provide a circuit board, including: a plurality of stacked core boards each having a top surface, wherein at least part core boards of the plurality of stacked core boards include circuit layers at top surfaces thereof; wherein a groove is defined through the at least part core boards; a conductive material is received in the groove configured to couple to the circuit layers of at least two core boards; wherein a cross section of the groove includes a length in a first direction and a length in a second direction, and the length in the first direction is greater than the length in the second direction; and electroplating solution is capable of contacting any portions of the groove to electroplate, to form the conductive material.

A technical solution adopted in the present disclosure is to provide a circuit board, including: a plurality of stacked core boards each having a top surface, wherein at least part core boards of the plurality of stacked core boards include circuit layers at top surfaces thereof; wherein a concave hole is defined through the at least part core boards, a conductive material is received in the hole configured to couple to the circuit layers in at least two of the core boards; a diameter of the hole in an axial direction adjacent to an opening portion is greater than a diameter far away from the opening portion; and the hole has enough space capable of being electroplated, to form the conductive material.

A technical solution adopted in the present disclosure is to provide a circuit board, including: a plurality of stacked core boards each having a top surface, wherein at least part core boards of the plurality of stacked core boards include circuit layers at top surfaces thereof; wherein a hole is defined through the at least part core boards; a conductive material is received in the hole configured to couple to the circuit layers of at least two core boards; wherein a length in a first direction of a cross section of the hole is greater than a length in a second direction; and a ratio of a depth of the hole to the length in the first direction is less than 1.2; or the length in the first direction of the cross section of the hole is equal to the length in the second direction; and the ratio of the depth of the hole to the length in the first direction or the length in the second direction is less than 2.

A circuit board provided in the present disclosure may include several core boards stacked. A groove penetrating a part of the core board may be defined on the circuit board. A conductive material may be formed in the groove configured to couple to the circuit layers in at least two of the core boards. A cross section of the groove includes a length in a first direction and a length in a second direction, and the length in the first direction is greater than the length in the second direction. Compared with a through hole in a conventional circular, in the present disclosure, an aspect ratio of the groove may be reduced, so that electroplating solution may contact any portions of the groove, and the electroplating ability may be improved.

DETAILED DESCRIPTION

The detailed description set forth below is intended as a description of the subject technology with reference to the appended figures and embodiments. It is understood that the embodiments described herein include merely some parts of the embodiments of the present disclosure, but do not include all the embodiments. Based on the embodiments of the present disclosure, all other embodiments that those skilled in the art may derive from these embodiments are within the scope of the present disclosure.

The detailed description set forth below is intended as a description of the subject technology with reference to the appended figures and embodiments.

Figure 1A:
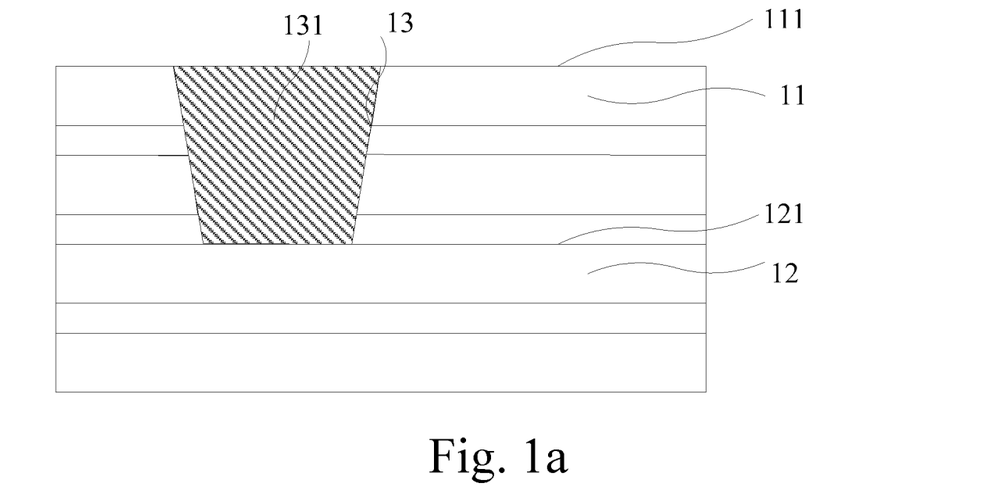
FIG. 1a is a structural illustration of a circuit board in accordance with an embodiment in the present disclosure.

Referring to FIG. 1a, FIG. 1a is a structural illustration of a circuit board in accordance with an embodiment in the present disclosure. The circuit board may include a plurality of stacked core boards 11, 12. Surfaces of the plurality of core boards 11, 12 may include circuit layer 111, 121. A groove 13 penetrating the plurality of core boards 11, 12 may be defined on the circuit board. A conductive material may be formed in the groove 13, and may be configured to couple to the circuit layers 111, 121 in at least two of the core boards 11, 12.

The core boards 11, 12 may be copper clad laminates. The copper clad laminate may be a basic material for making circuit boards, including a substrate board and copper foil covering the substrate. The copper clad laminate may be a basic material for manufacturing circuit boards, including a substrate board and a copper foil covering the substrate. The basic material may be made of a paper substrate, a glass fiber cloth substrate, a synthetic fiber cloth substrate, a non-woven substrate, a composite substrate, and other materials impregnated with resin, to make a bonding sheet, which is made by combining multiple bonding sheets. The copper foil may be coated on one side or both sides of the prepared substrate board, and then cured by heat and pressure to make a copper clad laminate. The circuit layers 111, 121 may be arranged on the copper foil on the surfaces of the core boards 11, 12.

Figure 1B:
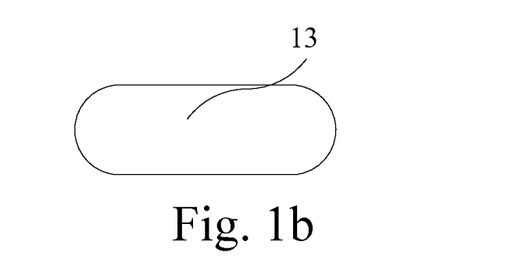
FIG. 1b is a cross section view of a circuit board in the present disclosure.

In the related art, a hole connecting the circuit layer is generally circular. In the present embodiment, a conventional circular hole may be stretched in one direction to change its shape, to change the shape of the groove 13 as shown in FIG. 1b. A cross section of the groove 13 may include a length in a first direction and a length in a second direction, and the length in the first direction may be greater than the length in the second direction. In an embodiment, the shape of the cross section of the groove 13 may also be elliptical, and so on. A shape may be adopted, as long as the shape is satisfied that the electroplating solution enters the groove 13 and contacts any portions of the groove 13 for electroplating. In an embodiment, a ratio of a depth of the groove 13 to the length in the first direction of the cross section of the groove 13 may be less than 1.2.

In this embodiment, a cross-sectional area of the groove 13 may be increased as much as possible when the shape of the groove 13 is changed. Under a condition of a same depth, an aspect ratio (a ratio of the groove depth to a long axis of the groove) may be reduced, to improve the electroplating ability, so that the groove 13 may be exposed to the electroplating solution at any portions during electroplating to form a conductive material. In an embodiment, the conductive material may be copper.

In this embodiment, an opening portion of the groove 13 may be located on the circuit layer 111 on the surface of the circuit board. A bottom of the groove 13 may overlap the circuit layer 121 in a middle layer of the circuit board. The groove 13 may be filled with the conductive material. The groove 13 may couple to the circuit layer 111 on a surface of the circuit board to the circuit layer 121 in the middle layer of the circuit board.

In this embodiment, the opening portion of the groove 13 may be located on the circuit layer 111 on the surface of the circuit board. The bottom may be located in the middle of the circuit board, and may overlap the circuit layer 121 of the core board 12 in the middle of the circuit board, to electrically connect the circuit layer 111 and the circuit layer 121 by passing through the conductive material in the groove 13. In this embodiment, a number of a groove formed in the groove 13 configured to couple to the circuit layer, may be 1, so that circuits on the circuit layer 111 and the circuit layer 121 may be respectively conducted.

Figure 2:
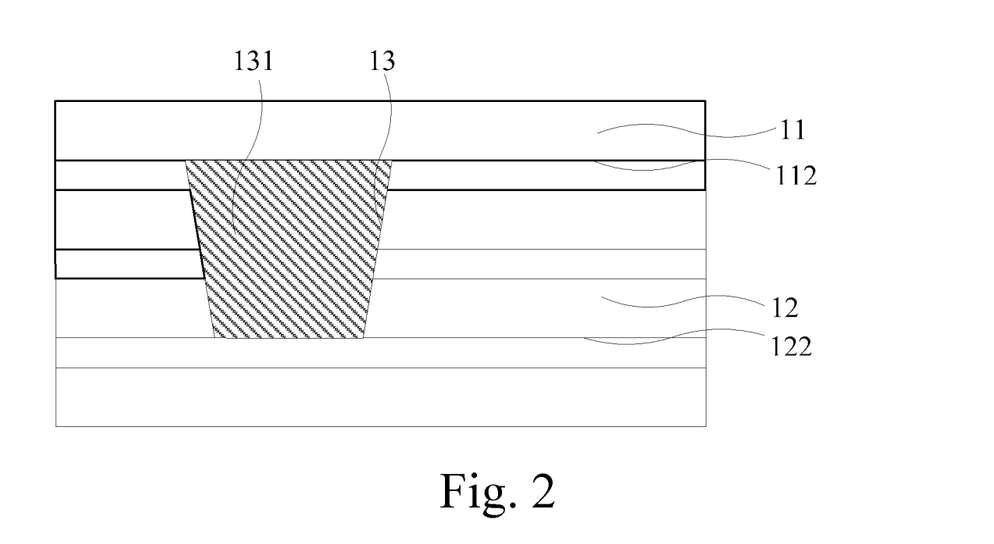
FIG. 2 is a structural illustration of a circuit board in accordance with an embodiment in the present disclosure.

In an embodiment, the groove 13 may be located in middle of the circuit board. Referring to FIG. 2, FIG. 2 is a structural illustration of a circuit board in accordance with an embodiment in the present disclosure. The opening portion of the groove 13 may overlap the circuit layer 112. The bottom of the groove 13 may overlap the circuit layer 122. The groove 13 may be filled with conductive material to electrically connect the circuit layer 112 of the core board 11 and the circuit layer 122 of the core board 12.

It should be noted that, when the electroplating process is performed in the groove 13 to fill the conductive material, the conductive material should be flush with the opening portion of the groove 13.

As in the above-mentioned embodiment, the bottom of the groove 13 may be located on one of the circuit layers of the core board 12. The bottom of the groove 13 may overlap the circuit layer 122. The circuits on the circuit layer 122 may be coupled to each other, i.e., the circuits on the circuit layer 122 may be electrically connected. In an embodiment, the circuits on the circuit layer 122 may not be coupled to each other, as shown in FIG. 4b.

In this embodiment, the shape of the groove 13 may be changed to increase the cross-sectional area of the groove 13, so that the aspect ratio is reduced. The electroplating ability in blind holes may be improved, and the aspect ratio of blind holes may be expanded, so that the wiring density of printed circuit board products may be increased.

Figure 3A:
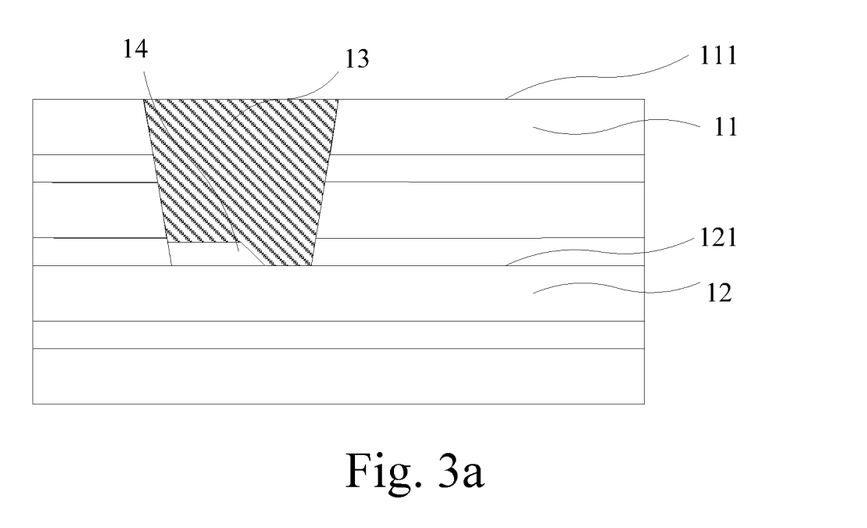
FIG. 3a is a structural illustration of a circuit board in accordance with an embodiment in the present disclosure.

Referring to FIG. 3a, FIG. 3a is a structural illustration of a circuit board in accordance with an embodiment in the present disclosure. A protrusion 14 may be arranged on the bottom of the groove 13 of the circuit board. A blind hole may be formed between the protrusion 14 and one side wall of the opposite groove 13. In order to prevent incomplete electroplating at portions (such as a blind hole) other than the portion of the protrusion 14 on the bottom of the groove 13, and prevent that not all the portions contact the conductive material, a thickness of the protrusion 14 may be limited to a preset threshold, i.e., a ratio of a height of the protrusion 14 to a diameter of the blind hole may be less than the preset threshold. The preset threshold may be a value that enables the electroplating solution to enter the groove 13 and contact any portions of the groove 13 including a hole wall, i.e., it is an aspect ratio threshold that is just enough to allow the electroplating solution to enter any portions of the groove 13. In an embodiment, the ratio of the height of the protrusion 14 to the diameter of the blind hole may be less than 1.

In this embodiment, the protrusion 14 may be located on one side of the bottom of the groove 13 and may couple to the side wall of the groove 13. The other side of the bottom of the groove 13 except the protrusion 14 may form a blind hole with the side wall of the protrusion. In addition, the remaining portions at the bottom of the groove 13 except the portion of the protrusion 14 may overlap the circuit layer 121. After the electroplating process is performed in the groove 13 and the groove 13 is filled with the conductive material, the conductive material may be flush with the opening portion of the groove 13. The conductive material may contact the circuit layer 121 on the bottom surface of the groove 13, so that the circuit layer 111 at the opening portion of the groove 13 may electrically connect the circuit layer 121 on the bottom of the groove 13.

Figure 3B:
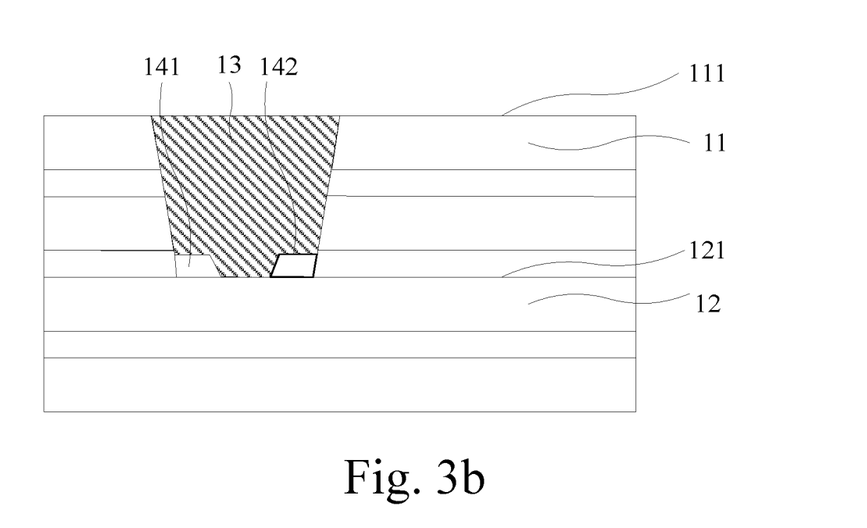
FIG. 3b is a structural illustration of a circuit board in accordance with an embodiment in the present disclosure.

In this embodiment, the number of the protrusion 14 may be 1. In other embodiments, the number of the protrusion 14 may be multiple. Referring to FIG. 3, FIG. 3b is a structural illustration of a circuit board in accordance with an embodiment in the present disclosure. The protrusion 14 may include protrusion 141 and protrusion 142. The protrusions 141, 142 may be located on both sides of the bottom of the groove 13, and may be coupled to the side walls of the groove 13. The protrusions 141, 142 may be not coupled to each other. Similar to the above-mentioned embodiment, the bottom of the groove 13 in this embodiment except the portions of the protrusions 141, 142 may overlap the circuit layer 121.

In the above-mentioned embodiment shown in FIG. 1a, FIG. 2, FIG. 3a and FIG. 3b, a hole formed by the groove 13 configured to couple to the circuit layer 111 and the circuit layer 121 or the circuit layer 112 and the circuit layer 122, may be 1. Therefore, the circuits on the circuit layer 111, the circuit layer 121, the circuit layer 112, and the circuit layer 122 may be coupled to each other. It should be noted that the groove 13 and the groove with the protrusion 14 in the above-mentioned embodiment may be located in the middle of the circuit board as an example shown in FIG. 2.

Figure 4A:
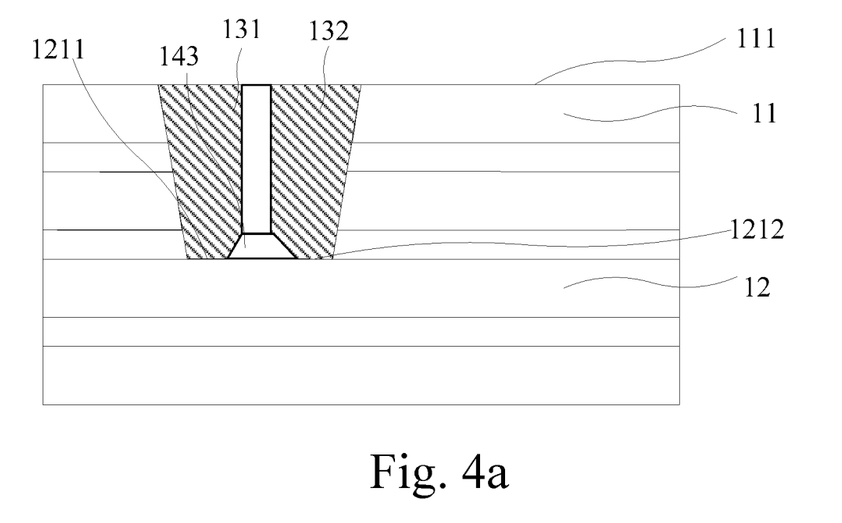
FIG. 4a is a structural illustration of a circuit board in accordance with an embodiment in the present disclosure.
Figure 4B:
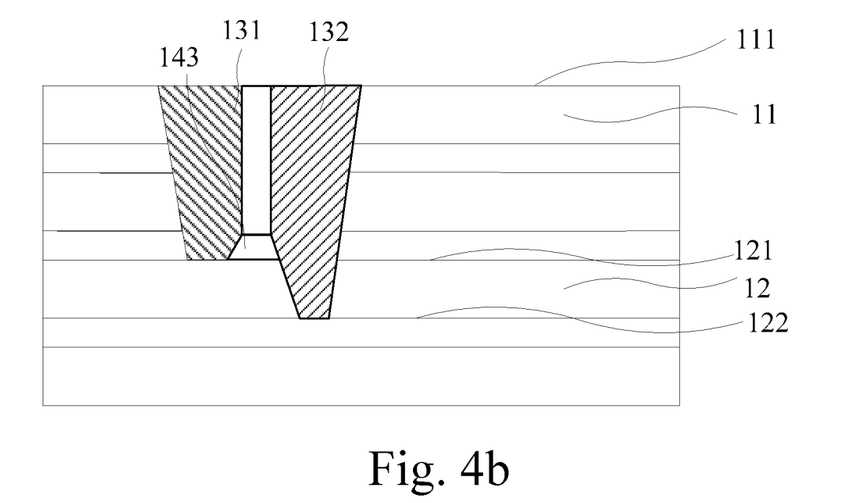
FIG. 4b is a structural illustration of a circuit board in accordance with an embodiment in the present disclosure.

Referring to FIG. 4, FIG. 4a is a structural illustration of a circuit board in accordance with an embodiment in the present disclosure. In this embodiment, a protrusion 143 may be located in the middle of the bottom of the groove 13. The protrusion 143 may be coupled to a side wall of the groove in one direction, and may be not coupled to a side wall in the other direction. An insulating material may be formed above the protrusion 143 to divide the groove 13 into a first blind hole 131 and a second blind hole 132 that are not electrically connected. The conductive material may be located in the first blind hole 131 and the second blind hole 132.

In this embodiment, the bottom of the groove 13 may be located on one of the circuit layers 121 on the core board 12 and may at least partially overlap the circuit layer 121. The bottoms of the first blind holes 131 and the second blind holes 132 in the groove 13 may be both located on the circuit layer 121.

In this embodiment, the connection between the first blind hole 131 and the second blind hole 132 may be disconnected, to form two independent holes. Further, the circuit layer 121 may include circuits 1211, 1212 that are non-conductive to each other. The conductive material at the bottom of the first blind hole 131 may contact the circuit 1211. The conductive material at the bottom of the second blind hole 132 may contact the circuit 1212. In an embodiment, the circuit layer 111 at the opening portion of the groove 13 corresponding to a circuit at the portion of the first blind hole 131 and the second blind hole 132 may also be non-conductive to each other.

In this embodiment, the bottom of the groove 13 may be located on one of the circuit layers 121 of the core board 12. The bottoms of the first blind hole 131 and the second blind hole 132 may be located on one of the circuit layers 121 on the core board 12. In another embodiment, the groove 13 may include staggered multi-layer bottoms. The staggered multi-layer bottoms may be respectively located on multiple circuit layers of several core boards. Referring to FIG. 4b, FIG. 4b is a structural illustration of a circuit board in accordance with an embodiment in the present disclosure. In this embodiment, the staggered multi-layer bottoms of the grooves 13 may be respectively located on the two circuit layers 121, 122 of the circuit board. Further, the bottom of the first blind hole 131 may overlap the circuit layer 121. The bottom of the second blind hole 132 may overlap the circuit layer 122. The conductive material in the first blind hole 131 may contact the circuit layer 121, to electrically connect the circuit layer 111 at the opening portion of the first blind hole 131 with the circuit layer 121 at the bottom of the first blind hole 131. The conductive material in the second blind hole 132 may contact the circuit layer 122, to electrically connect the circuit layer 111 at the opening portion of the second blind hole 132 with the circuit layer 122 at the bottom of the second blind hole 132. In an embodiment, a circuit in the circuit layer 111 at the opening portions of the first blind hole 131 and the second blind hole 132 corresponding to the first blind hole 131 and the second blind hole 132 may not be connected to each other.

In the above-mentioned embodiments, the groove 13 may be located in the middle of the circuit board. In addition, in the above-mentioned embodiments of the present disclosure, by changing the shape of the conventional hole from a circular shape to an elongated cross-sectional shape, the length of the cross section in the first direction may be larger than the length in the second direction. The cross-sectional area may be increased to a certain extent, thereby the purpose of reducing the aspect ratio and improving the electroplating ability, may be achieved.

In another embodiment of the present disclosure, the shape of the hole may not be changed, and it is still set to be circular. The diameter at the axial opening portion may be larger than the diameter at the portion away from the opening portion. However, in this embodiment, it is necessary to increase the diameter of the hole as much as possible, to have enough space in the hole for electroplating. The ratio of the depth of the hole to the diameter at the opening portion of the hole may be less than 2.

In an embodiment, when the hole is circular and the cross-sectional area is large enough, in order to further ensure that the electroplating solution can have sufficient exchange space, the protrusions as in the above-mentioned embodiments may also be provided at the bottom of the hole. The aspect ratio of the hole may be reduced at the bottom of the hole, so that any portions may be in contact with the conductive material during electroplating.

Figure 5:
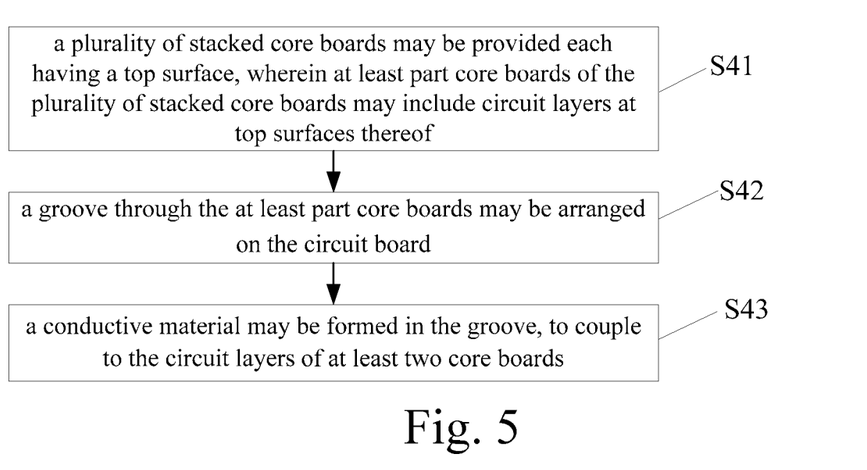
FIG. 5 and is a flow chart of a manufacturing method for a circuit board in accordance with an embodiment in the present disclosure.

The present disclosure further provides a manufacturing method for the above-mentioned embodiments. Referring to FIG. 5, FIG. 5 is a flow chart of a manufacturing method in accordance with the above-mentioned embodiments in the present disclosure. The method may include operations in the following blocks. Block S41, a plurality of stacked core boards may be provided each having a top surface, wherein at least part core boards of the plurality of stacked core boards may include circuit layers at top surfaces thereof.

A finished circuit board may be provided. Generally, the circuit board may be usually composed of laminated core boards. The surface of the core board may have a circuit layer. The core board may be copper clad laminates. The copper clad laminate may be a basic material for making circuit boards, including a substrate board and copper foil covering the substrate. The copper clad laminate may be a basic material for manufacturing circuit boards, including a substrate board and a copper foil covering the substrate. The basic material may be made of a paper substrate, a glass fiber cloth substrate, a synthetic fiber cloth substrate, a non-woven substrate, a composite substrate, and other materials impregnated with resin, to make a bonding sheet, which is made by combining multiple bonding sheets. The copper foil may be coated on one side or both sides of the prepared substrate board, and then cured by heat and pressure to make a copper clad laminate. The circuit layer may be arranged on the copper foil on the surface of the core board. When the core board is laminated, the prepreg is pressed at high temperature to make a circuit board.

Block S42, a groove through the at least part core boards may be arranged on the circuit board.

Usually, when an outermost circuit of the circuit board is connected, a through hole penetrating the circuit board may be provided on an outermost layer of the circuit board. When an outer layer is connected to an inner layer or when an inner layer is connected to an inner layer of the circuit board, a blind hole may be set on the circuit board from an outer layer to an designated inner layer, or a blind hole may be set on the circuit board from a designated inner layer to another designated inner layer. Then, electroplating process may be performed in a blind hole to make it conductive. Since the bottom of a blind hole is closed, when the circuit layer of the blind hole needs to be conducted in a deep portion, due to the limitation of the aspect ratio, the liquid cannot enter the bottom of the blind hole during electroplating. Therefore, in the present disclosure, in order to overcome the problem, the commonly used circular blind hole may be changed to a groove, and the length in the first direction of the cross section of the groove may be larger than the length in the second direction. In an embodiment, the ratio of the depth of the groove to the length in the first direction of the cross section of the groove may be less than 1.2.

Block S43: a conductive material may be formed in the groove, to couple to the circuit layers of at least two core boards.

After the groove is arranged, when the groove is to be electrically connected to the circuit, it is necessary to arrange a conductive material in the groove. The electroplating process may be performed in the groove, so that the electroplating solution may enter the groove and contact any portions of the groove to form the conductive material. In an embodiment, the groove may be filled with conductive material. In another embodiment, only a side wall of the groove may have conductive material.

Figure 6:
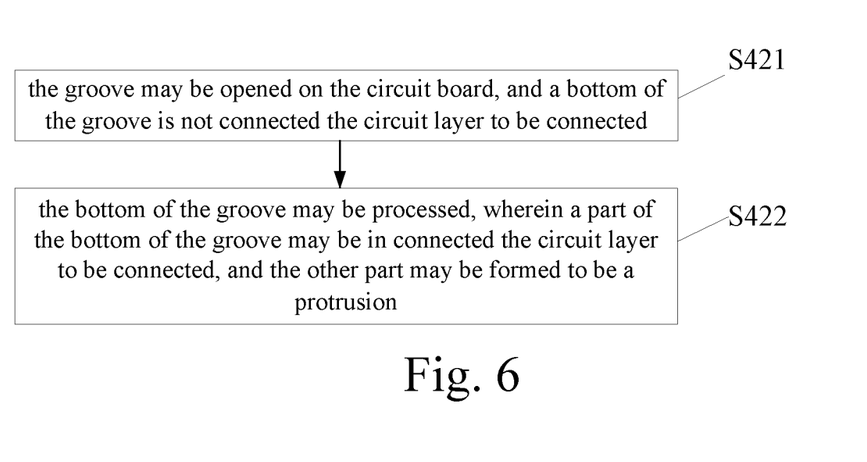
FIG. 6 is a flow chart of a manufacturing method for a circuit board in accordance with an embodiment in the present disclosure.

Referring to FIG. 6, block S42 may include operations in the following blocks.

Block S421, the groove may be opened on the circuit board, and a bottom of the groove is not connected the circuit layer to be connected.

A mechanical drill or a mechanical milling method may be adopted to open the groove on the circuit board. Since the mechanical drill or the mechanical milling method do not have not high accuracy, in order to avoid damage to the circuit layer during the groove arranging process, when a mechanical drill or a mechanical milling method is performed to arranged the groove, the bottom of the groove may be not connected the circuit layer, i.e., the circuit layer and the bottom of the groove may have a certain thickness.

Block S422, the bottom of the groove may be processed, wherein a part of the bottom of the groove may be in connected the circuit layer to be connected, and the other part may be formed to be a protrusion.

A laser drilling method may be adopted to process the bottom of the groove, to connect the bottom of the groove to the circuit layer to be connected. In this process, a part of the bottom of the groove may be connected to the circuit layer to be connected, and the other part may be formed to be a protrusion. The protrusion may further reduce the aspect ratio at the bottom of the groove, or the protrusion may be removed.

In this embodiment, the number of groove manufactured may be 1. The groove may be configured to connect two different circuit layers, and the circuits on each circuit layer may be electrically connected.

Figure 7:
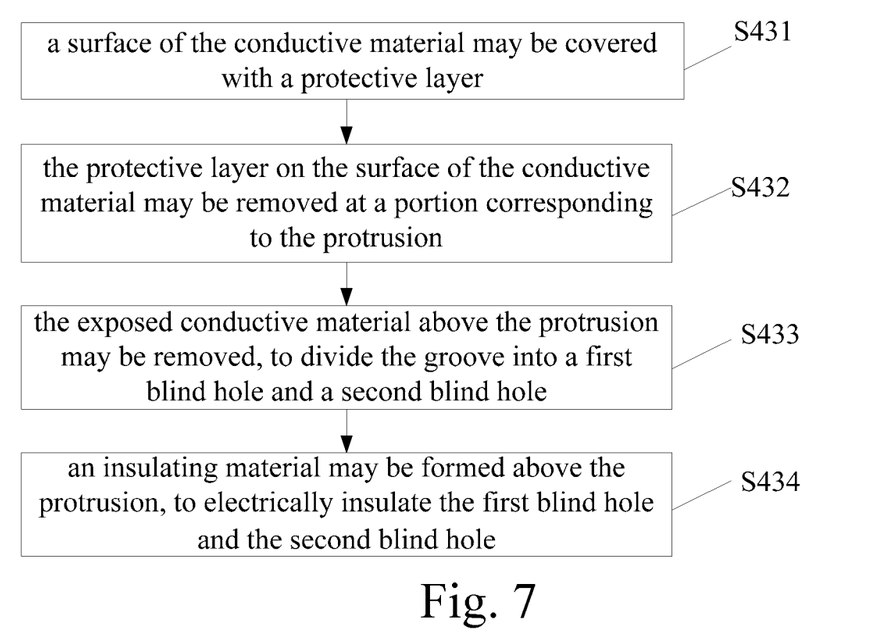
FIG. 7 is flow chart of a manufacturing method for a circuit board in accordance with an embodiment in the present disclosure.

Referring to FIG. 7, FIG. 7 is flow chart of a manufacturing method for a circuit board in accordance with an embodiment in the present disclosure. Compared with FIG. 6, this embodiment may further include operations in the following blocks after block S43.

Block S431, a surface of the conductive material may be covered with a protective layer.

After the conductive material is electroplated and filled in the groove, the electroplating method may be performed on a surface of the exposed conductive material on the surface of the groove, to form a protective layer to cover the conductive material. In this embodiment, the material of the protective layer may be made of tin.

Block S432, the protective layer on the surface of the conductive material may be removed at a portion corresponding to the protrusion.

A laser method may be adopted to remove the protective layer on the surface of the conductive material corresponding to the portion of the protrusion, so that the conductive material corresponding to the portion of the protrusion may be exposed.

Block S433, the exposed conductive material above the protrusion may be removed, to divide the groove into a first blind hole and a second blind hole.

The conductive material exposed above the protrusion may be removed by an alkaline etching method to divide the groove into a first blind hole and a second blind hole. The first blind hole and the second blind hole may be filled with the conductive material. After the conductive material above the protrusion is removed, the protective layer may protect the integrity of the conductive material in the first blind hole and the second blind hole, without affecting the conductive performance of the first blind hole and the second blind hole.

Block S434, an insulating material may be formed above the protrusion, to electrically insulate the first blind hole and the second blind hole.

The insulating material may be formed above the protrusion, to further electrically insulate the first blind hole and the second blind hole.

In this embodiment, the first blind hole and the second blind hole may be independent holes. It should be noted that, when the bottom of the first blind hole and the bottom of the second blind hole penetrate the same circuit layer, the circuit contacting the conductive material at the bottom of the first blind hole and the circuit contacting the conductive material at the bottom of the second blind hole, may be not connected to each other. When the bottom of the first blind hole and the bottom of the second blind hole penetrate different circuit layers, the circuit layers contacted by the conductive material at the bottom of the first blind hole and the second blind hole, may be different layers.

In this embodiment, the circuit board only describes a part of the related structure, and other structures are the same as the structure of the circuit board in the related art, therefore no additional description is given herein.

In the present disclosure, the aspect ratio of the hole configured to connect the circuit layer, may be changed. On one hand, the shape of the hole may be changed, and the length of the cross section in the first direction may be greater than the length in the second direction to form a groove, so that the ratio of the depth of the groove to the length in the first direction may be less than 1.2, to reduce the aspect ratio. Thereby, the bottom of the groove may have enough space for electroplating, so that the electroplating solution may reach any portion in the groove. On the other hand, the shape of the hole may not be changed, and the shape of the hole may be circle, but the ratio of the depth of the hole to the diameter of the hole may be less than 2. Thereby, the hole may have enough space for electroplating, to form the conductive material. In the present disclosure, on the one hand, the present disclosure may improve the electroplating ability of blind holes; on the other hand, the present disclosure may also increase the wiring density of printed circuit boards in a product.

It is understood that the descriptions above are only embodiments of the present disclosure. It is not intended to limit the scope of the present disclosure. Any equivalent transformation in structure and/or in scheme referring to the instruction and the accompanying drawings of the present disclosure, and direct or indirect application in other related technical field, are included within the scope of the present disclosure.

What is claimed is:

1. A circuit board, comprising:
   a plurality of stacked core boards each having a top surface, wherein at least part core boards of the plurality of stacked core boards comprise circuit layers at top surfaces thereof;
   wherein a groove is defined through the at least part core boards; a conductive material is received in the groove configured to couple to the circuit layers of at least two core boards;
   wherein a cross section of the groove comprises a length in a first direction and a length in a second direction, and the length in the first direction is greater than the length in the second direction;
   the cross section of the groove is a section formed by a plane cutting through the groove at right angles to an axis parallel with a thickness direction of the core boards; the first direction and the second direction are both in the cross section, and the first direction is perpendicular to the second direction; both of the first direction and the second direction are perpendicular to the axis parallel with the thickness direction of the core boards; and
   the groove is a blind groove; a bottom of the groove comprises a protrusion; a blind hole is formed between one side wall of the protrusion and an opposite side wall of the groove; a height of the protrusion is less than a diameter of the blind hole; a ratio between the height of the protrusion and the diameter of the blind hole is less than a preset threshold; and
   the ratio of the height of the protrusion to the diameter of the blind hole is less than 1.

2. The circuit board as claimed in claim 1, wherein a bottom of the groove is located on one of the circuit layers on the at least part core boards and at least partially overlaps the circuit layers.

3. The circuit board as claimed in claim 1, wherein the groove comprises staggered multilayer bottoms, wherein the staggered multilayer bottoms are respectively located on the circuit layers of the at least part core boards.

4. The circuit board as claimed in claim 1, wherein
   the number of the protrusion is one; the protrusion is located on one side of the bottom of the groove and couple to the side wall of the groove, and a blind hole is formed on the other side of the bottom of the groove; or
   the number of the protrusions is two, and the protrusions are located on both sides of the bottom of the groove and are respectively couple to the two side walls of the groove, and a blind hole is formed in middle of the bottom of the groove;
   the number of the protrusion is one, the protrusion is located at a center of the bottom of the groove; the protrusion is couple to the side wall of the groove in one direction, and is spaced apart with the side wall of the groove in the other direction, and a first blind hole and a second blind hole are formed on the other side of the bottom of the groove.

5. The circuit board as claimed in claim 1, wherein the conductive material covers the protrusion and is flush with an opening portion of the groove.

6. The circuit board as claimed in claim 4, wherein
   the conductive material is located in the first blind hole and the second blind hole; and an insulating material is formed above the protrusion to electrically insulate the first blind hole and the second blind hole;
   wherein the conductive materials on bottom surfaces of the first blind hole and the second blind hole are in contact with a same circuit layer; or
   the conductive materials on the bottom surfaces of the first blind hole and the second blind hole are in contact with different circuit layers.

7. The circuit board as claimed in claim 1, wherein a ratio of a depth of the groove to the length in the first direction of the cross section of the groove is less than 1.2.

8. A circuit board, comprising: a plurality of stacked core boards each having a top surface, wherein at least part core boards of the plurality of stacked core boards comprise circuit layers at top surfaces thereof; wherein a concave hole is defined through the at least part core boards, a conductive material is received in the concave hole configured to couple to the circuit layers of at least two core boards; a diameter of the concave hole in an axial direction adjacent to an opening portion is greater than a diameter far away from the opening portion; a bottom of the concave hole comprises a protrusion, the protrusion is arranged inside the concave hole; one side wall of the protrusion is couple to a wall of the concave hole, and the diameter of the concave hole has a sudden change in the axial direction; a blind hole is formed between the side wall of the protrusion and an opposite side wall of the concave hole; a ratio of a height of the protrusion to a diameter of the blind hole is less than a preset threshold; and a ratio of the height of the protrusion, to the diameter of the blind hole between the side wall of the protrusion and the opposite side wall of the concave hole, is less than 1.

9. The circuit board as claimed in claim 8, wherein the number of the protrusion is one; the protrusion is located on one side of the bottom of the concave hole and couple to the side wall of the concave hole, and a second blind hole is formed on the other side of the bottom of the concave hole; or the number of the protrusions is two, and the protrusions are located on both sides of the bottom of the concave hole and are respectively couple to the two side walls of the concave hole, and a second blind hole is formed in middle of the bottom of the concave hole; the number of the protrusion is one, the protrusion is located at a center of the bottom of the concave hole; the protrusion is couple to the side wall of the concave hole in one direction, and is spaced apart with the side wall of the concave hole in the other direction, and a first blind hole and a second blind hole are formed on the other side of the bottom of the hole.

10. The circuit board as claimed in claim 9, wherein the bottom of the concave hole is located on one of the circuit layers on the at least part core boards and at least partially overlaps the circuit layers.

11. The circuit board as claimed in claim 9, wherein the hole comprises staggered multilayer bottoms, wherein the staggered multilayer bottoms are respectively located on the circuit layers of the at least part core boards.

12. The circuit board as claimed in claim 11, wherein the conductive material covers the protrusion and is flush with the opening portion of the concave hole.

13. The circuit board as claimed in claim 11, wherein
the conductive material is located in the first blind hole and the second blind hole; and an insulating material is formed above the protrusion to electrically insulate the first blind hole and the second blind hole;
wherein the conductive materials on bottom surfaces of the first blind hole and the second blind hole are in contact with a same circuit layer; or
the conductive materials on the bottom surfaces of the first blind hole and the second blind hole are in contact with different circuit layers.

14. The circuit board as claimed in claim 8, wherein a ratio of a depth of the concave hole to the diameter of the hole in the opening portion is less than 2.

15. A circuit board, comprising: a plurality of stacked core boards each having a top surface, wherein at least part core boards of the plurality of stacked core boards comprise circuit layers at top surfaces thereof; wherein a hole is defined through the at least part core boards; a conductive material is received in the hole configured to couple to the circuit layers of at least two core boards; wherein a length in a first direction of a cross section of the hole is greater than a length in a second direction; and a ratio of a depth of the hole to the length in the first direction is less than 1.2; or the length in the first direction of the cross section of the hole is equal to the length in the second direction; and the ratio of the depth of the hole to the length in the first direction or the length in the second direction is less than 2; the cross section of the hole is a section formed by a plane cutting through the hole at right angles to an axis parallel with a thickness direction of the core boards; the first direction and the second direction are both in the cross section, and the first direction is perpendicular to the second direction; both of the first direction and the second direction are perpendicular to the axis parallel with the thickness direction of the core boards; a bottom of the hole comprises a protrusion, the protrusion is arranged inside the hole: one side wall of the protrusion is coupled to a wall of the hole: a blind hole is formed between the side wall of the protrusion and an opposite side wall of the hole; a ratio of a height of the protrusion to a diameter of the blind hole is less than a preset threshold; and a ratio of the height of the protrusion, to the diameter of the blind hole between the side wall of the protrusion and the opposite side wall of the hole, is less than 1.

16. The circuit board as claimed in claim 15, wherein
an axial space of the hole decreases sequentially from top to bottom; or
the axial space of the hole is same from top to bottom.

* * * * *